United States Patent [19]

Papanicolaou

[11] Patent Number: 4,640,003
[45] Date of Patent: Feb. 3, 1987

[54] METHOD OF MAKING PLANAR GEOMETRY SCHOTTKY DIODE USING OBLIQUE EVAPORATION AND NORMAL INCIDENCE PROTON BOMBARDMENT

[75] Inventor: Nicolas A. Papanicolaou, Silver Spring, Md.

[73] Assignee: The United States of America as represented by the Secretary of the Navy, Washington, D.C.

[21] Appl. No.: 781,560

[22] Filed: Sep. 30, 1985

[51] Int. Cl.⁴ .................. H01L 29/56; H01L 21/283
[52] U.S. Cl. .................................. 29/576 B; 29/571; 148/1.5; 148/175; 148/187; 148/DIG. 84; 148/DIG. 140; 427/86
[58] Field of Search ............... 29/571, 576 B; 148/1.5, 148/175, 187; 427/86

[56] References Cited

U.S. PATENT DOCUMENTS

| | | | |
|---|---|---|---|
| 4,171,234 | 10/1979 | Nagata et al. | 148/175 |
| 4,201,999 | 5/1980 | Howard et al. | 357/15 |
| 4,316,201 | 2/1982 | Christou et al. | 357/15 |
| 4,325,747 | 4/1982 | Ristow | 148/1.5 |
| 4,377,899 | 3/1983 | Otani et al. | 29/571 |
| 4,532,698 | 8/1985 | Fang et al. | 29/571 |
| 4,559,238 | 12/1985 | Bujatti et al. | 427/82 |

Primary Examiner—Upendra Roy
Attorney, Agent, or Firm—Sol Sheinbein; Murriel E. Crawford

[57] ABSTRACT

A Schottky diode and method of making same in which a n+ doped layer, an n doped layer and an undoped layer of a semi-insulating material selected from the group consisting of gallium arsenide, aluminum gallium arsenide and indium phosphide is grown consecutively on a semi-insulating substrate made of the same material. A mesa with acute angled sides is etched on the undoped layer to such a depth that the n doped layer is exposed. A Schottky and ohmic contact are then deposited on opposite sides of the mesa. The exposed n layer is then bombarded with protons at normal incidence.

7 Claims, 6 Drawing Figures

METHOD OF MAKING PLANAR GEOMETRY SCHOTTKY DIODE USING OBLIQUE EVAPORATION AND NORMAL INCIDENCE PROTON BOMBARDMENT

BACKGROUND OF THE INVENTION

The present invention relates to Schottky diodes and in particular, Schottky diodes with planar geometry and the method of making same.

A Schottky diode is a rectifying metal semiconductor junction. This diode is used in microwave circuits as a mixer where a local oscillator waveform is combined with an incoming signal to produce a difference frequency known as the intermediate frequency.

The performance of the Schottky diode is typically gaged by the product of its series resistance and its junction capacitance. This product must be minimized for the best performance to be achieved.

A high conductivity active layer is used in the Schottky diode to reduce the series resistance, but this also increases the capacitance. The capacitance is reduced by making the Schottky contact itself as small as possible. In general, the area of these contacts is less than $10^{-7} cm^2$. Because of the size of the Schottky contact, fabrication of the Schottky diode has always been a problem.

The whisker diode, a particular type of Schottky diode, was fabricated by producing a matrix of holes in an oxide deposited on the semiconductor and dropping a whisker at random in one hole and holding it by contact pressure. There were several disadvantages with this structure. The parasitic capacitance was high, it was not mechanically rugged being adversely affected by humidity and mechanical shock, and fabrication was both difficult and expensive.

The planar mixer diode, another type of Schottky diode, is more reliable and rugged than the whisker diode. It consists of a high conductivity n+ layer and n layer grown consecutively on a gallium arsenide substrate by any epitaxial method. The Schottky contact itself is a narrow metal finger typically of titanium-tungsten. The Schottky contact is placed close to and is surrounded by the ohmic contact which is typically made of gold-germanium. The capacitance is reduced by making the Schottky contact as small as possible. It often has an area as small as one micrometer to ten micrometers. The stray capacitance is reduced by making the diode semi-insulating by bombarding it with protons while leaving an active region in the vicinity of the contacts. Registration and fabrication of this device is also difficult and expensive because of the size of the Schottky contact and its closeness to the ohmic contact.

SUMMARY OF THE INVENTION

It is an object of the present invention to structure a Schottky diode with planar geometry that performs reliably at high frequencies.

It is a further object of the present invention to fabricate a Schottky diode by a simple and inexpensive method.

It is still a further object of the present invention to structure a Schottky diode with low parasitic capacitance and low series resistance.

These and other objects are achieved by epitaxially growing an n+ layer, n layer and undoped layer consecutively on a semi-insulating substrate made of gallium arsenide, indium phosphide, or gallium aluminum arsenide, producing a mesa with acute angled sides sloping inward from the top so that the sides of the mesa shadow the area directly underneath said sides on both sides of the mesa and so that the n layer is exposed, forming a Schottky contact on one side of the mesa, forming a ohmic contact on the opposite side of the mesa, and rendering the n layer and n+ layer semi-insulating except the portion of the n layer and n+ layer directly underneath the acute angled sides of the mesa.

DETAILED DESCRIPTION OF THE INVENTION

Figure 1:
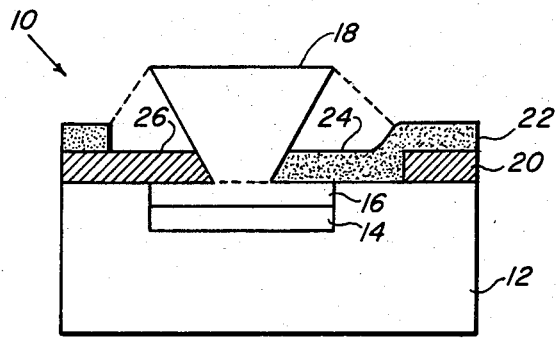
FIG. 1 is a schematic drawing of the Schottky diode of the invention.

Referring now to the drawings wherein like reference numerals designate identical or corresponding parts throughout the several views.

FIG. 1 depicts the Schottky diode 10 of the invention. Substrate 12 is made of semi-insulating material that is either gallium arsenide (GaAs), indium phosphide (InP), or gallium aluminum arsenide (GaAlAs). An n+ layer 14 made of n+ doped material that is the same as the substrate material is imbedded in the substrate 12. An n layer 16 made of n doped material, that is also the same as the substrate material is in contact with and coextensive with the n+ layer on one of its surfaces and flush with the top surface of the substrate 12 on the other surface. A mesa 18 with acute angled sides sloping inward from the top made of undoped material is in contact with the n layer 16. A layer of Schottky material 20 such as titanium-tungsten or titanium is in contact with the exposed surface of the substrate 12. A layer of ohmic material 22, is in contact and coextensive with the Schottky material 20. This ohmic material is any material that allows current to pass through without rectification such as gold germanium. An ohmic contact 24 made of one of the above mentioned materials is in contact with the n layer 16 on one side of the mesa 18 and a Schottky contact 26 made of the Schottky material is in contact with n layer 16 on the opposite side of mesa 18.

The active n+ layer 14 and n layer 16 reduce the resistance of the device because of their relatively high conductivity. The n+ layer 14 is typically from 1 micrometer to 4 micrometers preferably 2.5 micrometers thick. The n layer 16 is typically from about 0.2 micrometers to about 0.6 micrometers preferably 0.5 micrometers thick. The n+ layer 14 is doped with any n+ dopant such as tin, germanium or silicon; preferably silicon. The doping concentration is typically between about $1\times10^{18}$cm$^{-3}$ to about $1\times10^{19}$cm$^{-3}$ preferably from about $2\times10^{18}$cm$^{-3}$ to about $1\times10^{19}$cm$^{-3}$. This doping concentration should be as high as possible as it reduces the series resistance.

The n layer 16 is doped with any n type dopant such as tin, germanium or silicon; preferrably silicon. The doping concentration is from about $5\times10^{16}$cm$^{-3}$ to $3\times10^{17}$cm$^{-3}$ preferably $1\times10^{17}$cm$^{-3}$. At higher doping concentrations, the Schottky contact 26 will degenerate and at lower doping concentration, the resistance is increased.

Mesa 18 has acute angled sides sloping inward from the top, preferably from 55° to 65° and most preferably 60° angles to the plane of substrate 12. The mesa is naturally formed during the etching process. The width of the top surface of mesa 18 is equal to the width of n layer 16 and n+ layer 14.

The Schottky contact 26 is placed as close as possible to the ohmic contact 24 to minimize the resistance. As the frequency increases, the loss in the Schottky diode 10 due to parasitic capacitance increases. To minimize this loss, the width or distance away from the mesa of the Schottky contact 26 is made as small as possible. For high frequency applications, the dimensions of the Schottky contact 26 must be as small as about 1 micrometer by about 10 micrometers, because larger contacts are associated with increased loss.

Figure 2:
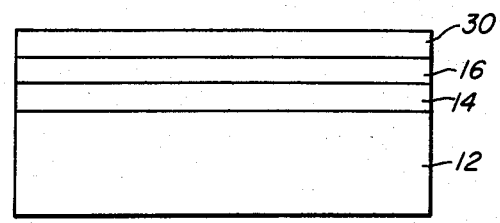
FIG. 2 is the schematic drawing of the semiconductor material with n layer, n+ layer and undoped layer epitaxially grown thereon.

Next, the steps for fabricating the Schottky diode with the above structure will be described in detail. With the substrate 12 made of semi-insulating material, oriented in the (100) direction an n+ layer 14 made of the same material as the substrate, an n layer 16 made of this same material and an undoped layer 30 made of the substrate material are grown consecutively thereon. The end result is depicted in FIG. 2. The layers are grown by any epitaxial method such as molecular beam epitaxy, vapor phase epitaxy, organo metallic chemical vapor deposition, or liquid phase epitaxy.

Figure 3:
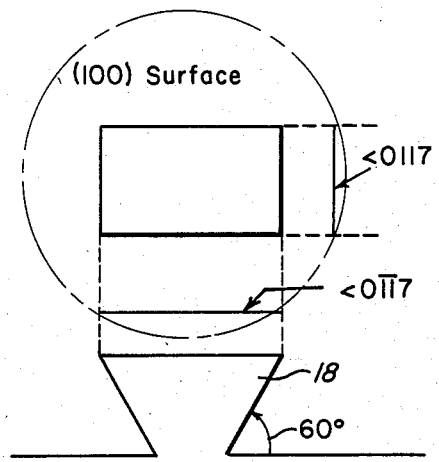
FIG. 3 is a schematic drawing of the etching of the undoped layer along orthogonal 011 directions on the (100) surface.
Figure 4:
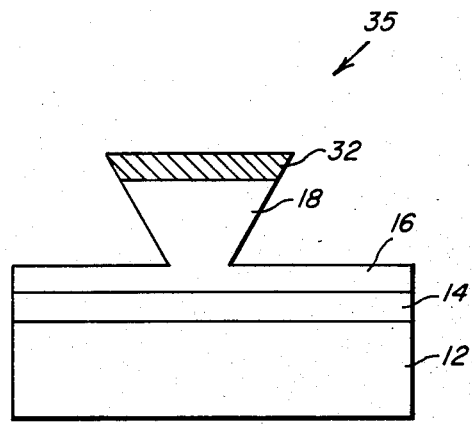
FIG. 4 is a schematic drawing of the semiconductor material and n layer and n+ layer after the mesa has been etched on the undoped layer.

Thereafter, a polyimide film 32 typically of thickness between 0.5 micrometers and 2.5 micrometers preferably 1 micrometer is deposited on the undoped layer 36 and heated to a temperature from about 135° C. to about 180° C. in air until cured. A positive photoresist and developer with a mask is used to outline a rectangular pattern. Mesa 18 is then etched using an acidic hydrogen peroxide solution experimentally shown to etch the semiconductor material in the form of a mesa on the surface using the polyimide film 32 pattern as a mask. Etching the (100) surface in the above mentioned solution produces step profiles that are non-equivalent for steps running in orthogonal 011 directions as shown in FIG. 3. Mesa 18 thus created has its long side along the 011 orientation and acute angled sides sloping inward from the top. Mesa 18 is etched so that all the undoped layer 30 is removed and the n layer 16 is exposed. The overhang of the photoresist caused by lateral etching of the undoped layer 30 is eliminated by spraying with water for one minute. The resultant multilayer wafer 35 is depicted in FIG. 4.

Figure 5:
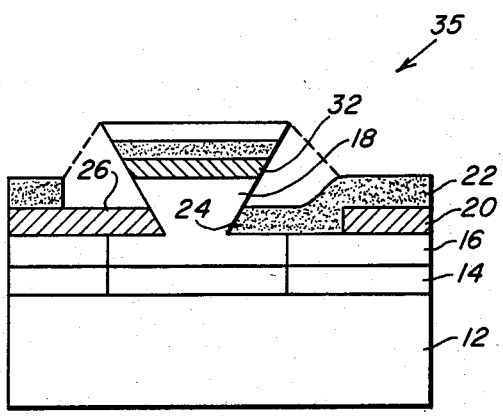
FIG. 5 is a schematic drawing of the semiconductor material and n layer, n+ layer and mesa after the Schottky and ohmic materials have been evaporated thereon.

Thereafter, a pattern for contact metallization is defined with positive photoresist for lift-off. The Schottky contact 26 is formed first by evaporating a Schottky material in a vacuum between $1\times10^{-7}$ Torr and $5\times10^{-7}$ Torr with the wafer 35 oriented 60 degrees ($\pm5°$) with respect to the beam as depicted. This orientation allows the mesa to shadow one side of the n layer 16 from the beam of Schottky material. Next, the wafer 35 is rotated by 60° ($\pm5°$) and the ohmic material is evaporated in vacuum of $1\times10^{-7}$ Torr to $5\times10^{-7}$ Torr forming the ohmic contact 24. The mesa 18 shadows each Schottky contact 26 from the ohmic material beam. The length of the contacts is determined by the narrow neck of the polymide film 32. The width, w, of the contacts is determined by both the depth, d, and the acute angle of the mesa as defined by the equation w=d ctn 60°. The resultant wafer 35 is depicted in FIG. 5.

Next, a photoresist is dissolved using acetone and the unwanted metallization on top of mesa 18 is removed.

Thereafter, the wafer 35 is bombarded with protons of a dosage capable of penetrating the n layer 16 and the n+ layer 14, but not enough to penetrate the polymide film 32. The protons typically have an energy of 150 KeV. This bombardment results in the n layer 16 and n+ layer 14 being semi-insulating in those areas where the protons penetrate. A buried active n+ layer and n layer underneath the mesa 18 exists because the acute angled sides of the mesa 18 shadowed this area from proton bombardment. Mesa 18 shadows the Schottky contact 26 and the ohmic contact 24 because the protons are bombarded at normal or near normal incidence.

The polyimide film 32 is dissolved and the metallization on top of the mesa 18 is lifted off using a positive photoresist developer.

The ohmic contact 24 is then annealed by heating the wafer 35 to between 390° to 450° preferably 425° in an inert gas preferrably a gas mixture of 10% hydrogen and 90% nitrogen. Titanium-tungsten and titanium have been shown to remain stable at this temperature and therefore the Schottky contact is not expected to degrade in the annealing process.

Figure 6:
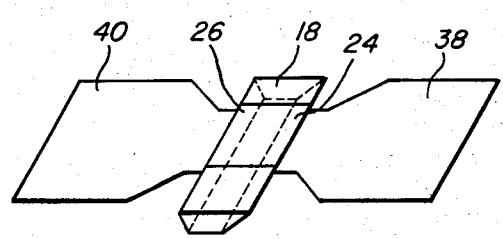
FIG. 6 is a schematic of the topology of the Schottky diode.

In operation the ohmic contact 24 is connected to ground through contact pad 38 and the Shottky contact 26 is connected to the input through contact pad 40 as shown in FIG. 6 which depicts the topology of the Schottky Diode. The diode then operates as a mixer combining two inputed signals of different frequencies to produce an output signal with an intermediate (difference) frequency.

EXAMPLE

In the following example, the n+ layer 14, n layer 16, and undoped layer 30 were grown consecutively on a semi-insulating GaAs substrate 12 using molecular beam epitaxy. The n+ layer 14 had a thickness of 2.5 micrometers. The n+ layer 14 was doped with silicon prior to being grown on the substrate to a concentration of $1\times10^{18}$cm$^{-3}$. The n layer 16 had a thickness of 0.5 micrometers. The n layer 16 was doped with silicon prior to being grown on the n+ layer 14 to a concentration of $1\times10^{17}$cm$^{-3}$. The undoped GaAs layer 30 was grown to a thickness of 2.5 micrometers thick.

A polyimide film 32 one micrometer thick was deposited with a spinner on the undoped layer 30 and cured in air at 150° C. for one-half hour.

A rectangular pattern on the polyimide film 32 was formed by use of positive photoresist AZ-1370 by AZ Corporation and a photoresist developer AZ-312 by AZ Corporation. Mesa 18 is then etched on the GaAs surface using a solution of one part sulfuric acid, one part hydrogen peroxide and one part water with the polyimide film 32 pattern used as a mask. The overhang was eliminated by spraying with water for one minute.

Thereafter, a pattern for contact metallization was defined with positive photoresist AZ-1370 by AZ Corporation for lift-off. The Schottky contact 24 was formed by evaporating titanium tungsten (TiW) in a vacuum of $1 \times 10^{-7}$ Torr with the wafer 35 oriented 60° with respect to the beam of TiW. Next, the wafer 35 was rotated by 60° and AuGe evaporated in a vacuum of $1 \times 10^{-7}$ Torr to form the ohmic contact 26.

Next, the photoresist was dissolved using acetone and the unwanted metallization was removed.

Thereafter, the wafer 35 was bombarded with 150 keV protons at normal incidence thereby making the n layer 16 and the n+ layer 14 semi-insulating except for the portions that are the shadowed by the polyimide film 32 on mesa 18.

The polyimide film 32 was then dissolved using AZ-312 developer. The ohmic contact 26 is thereafter annealed at 425° C. for 2 minutes in a gas mixture of 10% hydrogen and 90% nitrogen.

The Schottky diode of the invention performs well at high frequencies and has very low parasitic capacitance and series resistance. Further, the Schottky diode of the invention is fabricated simply and inexpensively.

Obviously, additional modifications and variations of the present invention are possible in light of the above teachings. It is therefore to be understood that within the scope of the appended claims, the invention may be practiced otherwise than as specifically described herein.

What is claimed and desired to be secured by Letters Patent in the United States is:

1. A method of fabricating a Schottky diode comprising the steps of:
   providing a semi-insulating substrate of material selected from the group consisting of aluminum gallium arsenide, gallium arsenide and indium phosphide;
   growing sequentially an n+ doped layer of the material, an n doped layer of the material, and an undoped layer of the material consecutively on the substrate;
   depositing a polyimide on at least one region of the undoped layer;
   masking at least one region on the undoped layer to produce at least one masked and one unmasked region;
   etching away said unmasked region to produce a mesa with acute angled sides sloping inward from the top on the undoped layer so that the sides of the mesa define two recessed areas underneath the mesa;
   depositing a Schottky material at an angle on the exposed n doped layer so that the recessed area on one side of the mesa is not covered with Schottky material;
   depositing an ohmic material at an angle on the exposed n doped layer and on the Schottky material so that the recessed area on the other side of the mesa is not covered with ohmic material;
   bombarding the Schottky material and ohmic material with protons at normal incidence so that the recessed areas are untouched; and
   annealing the ohmic contact.

2. A method as in claim 1 wherein the n+ doped layer is from about 1 micrometer to about 4 micrometers preferably 2.5 micrometers thick and has a doping concentration of from about $1 \times 10^{18} cm^3$ to about $1 \times 10^{19} cm^{-3}$ preferably $2 \times 10^{18} cm^{-3}$, the n doped layer is from about 0.2 micrometers to about 0.6 micrometers preferably 0.5 micrometers thick and has a doping concentration of from about $5 \times 10^{16} cm^{-3}$ to about $3 \times 10^{17} c,^{-3}$ preferably $1 \times 10^{17} cm^{-3}$ and the undoped layer is from about 1 micrometer to 5 micrometers preferably 2.5 2.5 micrometers thick.

3. A method as in claim 1 wherein the step of masking further comprises the steps of:
   producing a rectangular pattern on the undoped layer by use of a positive photoresist and a mask with a rectangular pattern and a photoresist developer;
   etching the undoped layer to produce a mesa.

4. A method as in claim 1 wherein the step of depositing the ohmic and Schottky contacts comprises the steps of:
   producing a pattern on each side of the mesa for contact metallization with a positive photoresist;
   evaporating the Schottky material in a vacuum with the n doped layer oriented from about 55° to about 65° preferably 60° with respect to the beam;
   rotating the Schottky diode from about 55° to about 65° preferably 60°;
   evaporating the ohmic material in vacuum; and
   dissolving the photoresist with acetone.

5. A method as in claim 1 wherein the n doped layer is bombarded at normal incidence with protons of a dosage preferably 150 KeV, capable of penetrating the n doped layer and the n+ doped layer but not capable of penetrating the polyimide.

6. A method as in claim 1 wherein the ohmic contact is annealed at from about 390° to 450° preferably 425° C. for two minutes.

7. A method of fabricating a Schottky diode comprising the steps of:
   growing an n+ doped layer of gallium arsenide on a semi-insulating gallium arsenide substrate;
   growing an n doped layer of gallium arsenide on the n+ doped layer;
   growing an undoped layer of gallium arsenide on the n doped layer;
   depositing a polyimide with a spinner on the undoped layer;
   curing the polyimide at approximately 150° C. for one half hour;
   aligning the substrate and n+ layer, n layer, and undoped layer along the 011 orientation;
   providing a rectangular pattern on the undoped layer by use of a positive photoresist and a photoresist developer;
   etching a mesa on the undoped layer with a solution of one part sulfuric acid, one part hydrogen peroxide and two parts water to a depth so that all the undoped layer is removed exposing the n active layer;
   defining a pattern on each side of the mesa for contact metallization with positive photoresist;
   evaporating the Schottky material in vacuum on one side of the mesa with the n layer oriented approximately 60° with respect to the beam;
   rotating the n layer by approximately 60°;
   evaporating ohmic material in vacuum on the other side of the mesa;
   dissolving the photoresist with acetone;
   bombarding the n layer at normal incidence with approximately 150 KeV protons; and
   annealing the ohmic contact at approximately 425° for approximately two minutes.

* * * * *